United States Patent
Lee et al.

(10) Patent No.: US 8,720,053 B2
(45) Date of Patent: May 13, 2014

(54) PROCESS OF FABRICATING A CIRCUIT BOARD

(75) Inventors: Shih-Chang Lee, Kaohsiung County (TW); Kun-Ching Chen, Tainan (TW); Ming-Loung Lu, Kaohsiung (TW); Chun-Che Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 942 days.

(21) Appl. No.: 12/535,895

(22) Filed: Aug. 5, 2009

(65) Prior Publication Data

US 2010/0071937 A1   Mar. 25, 2010

(30) Foreign Application Priority Data

Sep. 23, 2008  (TW) .............................. 97136540 A (51) Int. Cl.
   *H01K 3/10*  (2006.01)
(52) U.S. Cl.
   USPC ................... 29/852; 29/825; 29/829; 29/846; 29/848
(58) Field of Classification Search
   USPC ................... 29/852, 825, 829–832, 846, 848; 174/255, 256, 261, 265, 524
   See application file for complete search history.

(56) References Cited

U.S. PATENT DOCUMENTS

| | | | |
|---|---|---|---|
| 6,378,201 B1 * | 4/2002 | Tsukada et al. | 29/852 |
| 7,560,650 B2 * | 7/2009 | Chan et al. | 174/255 |
| 2008/0136033 A1 | 6/2008 | Nagamatsu et al. | |

FOREIGN PATENT DOCUMENTS

CN          101345228        1/2009

OTHER PUBLICATIONS

"First Office Action of China Counterpart Application", issued on Mar. 3, 2011, p. 1-p. 3.
"Office Action of Taiwan Counterpart Application", issued on May 30, 2012, p. 1-p. 5.

* cited by examiner

*Primary Examiner* — Thiem Phan
(74) *Attorney, Agent, or Firm* — J.C. Patents (57) ABSTRACT

A process for fabricating a circuit board that includes a dielectric layer, a circuit layer, and an insulation layer. The circuit layer is disposed on the dielectric layer and has a pad region and a trace region. The insulation layer is disposed on the circuit layer and covers the trace region. Here, a thickness of the pad region is less than a thickness of the trace region.

12 Claims, 12 Drawing Sheets

PROCESS OF FABRICATING A CIRCUIT BOARD

CROSS-REFERENCE TO RELATED APPLICATION

This application claims the priority benefit of Taiwan application serial no. 97136540, filed Sep. 23, 2008. The entirety of the above-mentioned patent application is hereby incorporated by reference herein and made a part of this specification.

BACKGROUND OF THE INVENTION

1. Field of the Invention

The present invention relates to a circuit board and a process of fabricating the same. More particularly, the present invention relates to a circuit board in which a circuit layer includes two regions with different thicknesses and a process of fabricating said circuit board.

2. Description of Related Art

A wire bonding technology is a common chip packaging technology applied to electrically connect a chip to a carrier. Here, the carrier is, for example, a circuit board. Generally, the wire bonding technology includes forming a stud bump in a wire bonding pad region of the carrier with use of a stud bump machine and extending wires upward with a distance. After that, the wires are moved downward to a chip pad region and are stitched. By applying the wire bonding technology, the chip and the carrier can be electrically connected to each other by means of the wires, and thereby signals can be transmitted between the chip and the carrier through the wires.

Figure 1A:
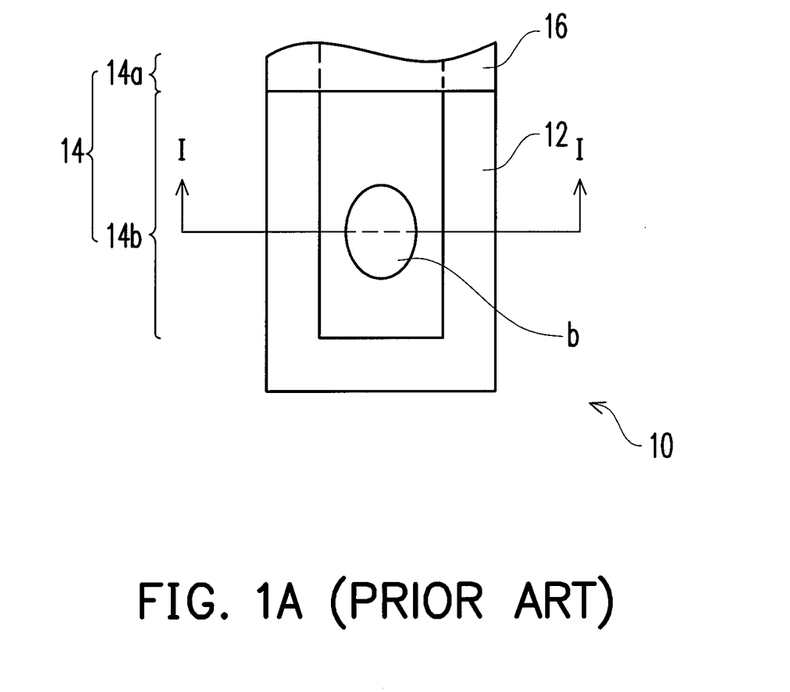
FIG. 1A is a schematic top view of a normal wire bonding structure of a circuit board according to the pertinent art.
Figure 1B:
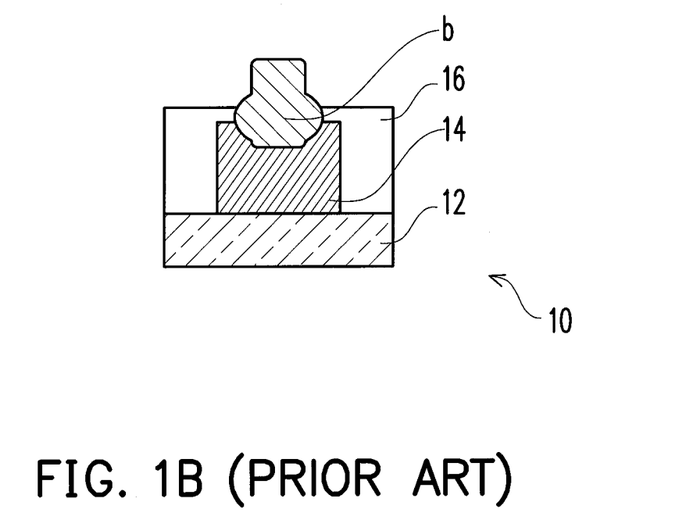
FIG. 1B is a cross-sectional view of the circuit board depicted in FIG. 1A along a line I-I.

FIG. 1A is a schematic top view of a normal wire bonding structure of a circuit board according to the pertinent art. FIG. 1B is a cross-sectional view of the circuit board depicted in FIG. 1A along a line I-I. Referring to FIGS. 1A and 1B, a conventional circuit board 10 includes a dielectric layer 12, a circuit layer 14, and a solder mask layer 16. The circuit layer 14 is disposed on the dielectric layer 12 and has a trace region 14a and a wire bonding pad region 14b. The solder mask layer 16 is disposed on the circuit layer 14, and the circuit layer 14 covers the trace region 14a.

When a wire bonding process is implemented, a stud bump b is formed on the wire bonding pad region 14b and is electrically connected to the circuit layer 14 through the wire bonding pad region 14b. The stud bump b depicted in FIGS. 1A and 1B are normally located at the center of the wire bonding pad region 14b, and therefore stresses and pulling forces applied to the wire bonding pad region 14b can be evenly distributed onto the circuit board 10 during implementation of the wire bonding process.

Figure 2A:
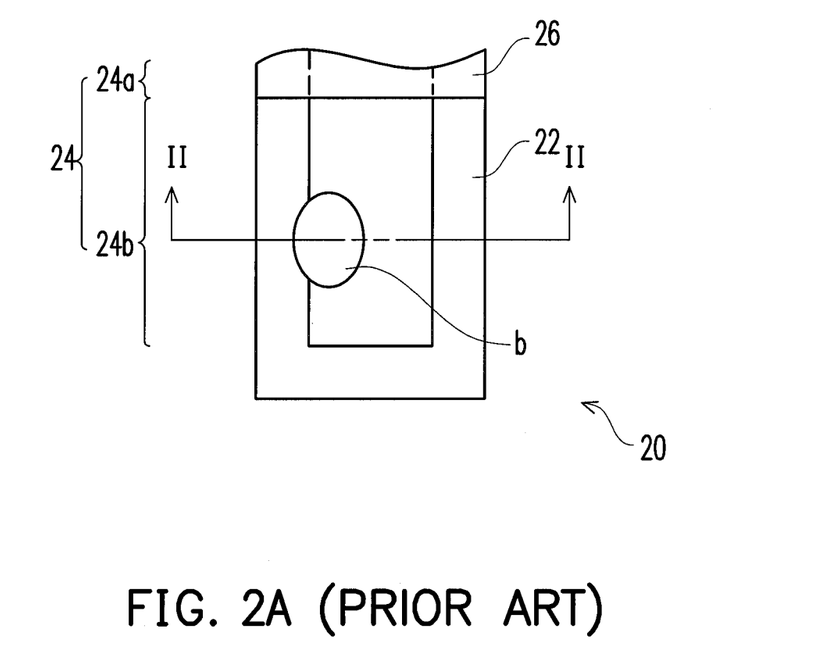
FIG. 2A is a schematic top view of an abnormal wire bonding structure of a circuit board according to the pertinent art.
Figure 2B:
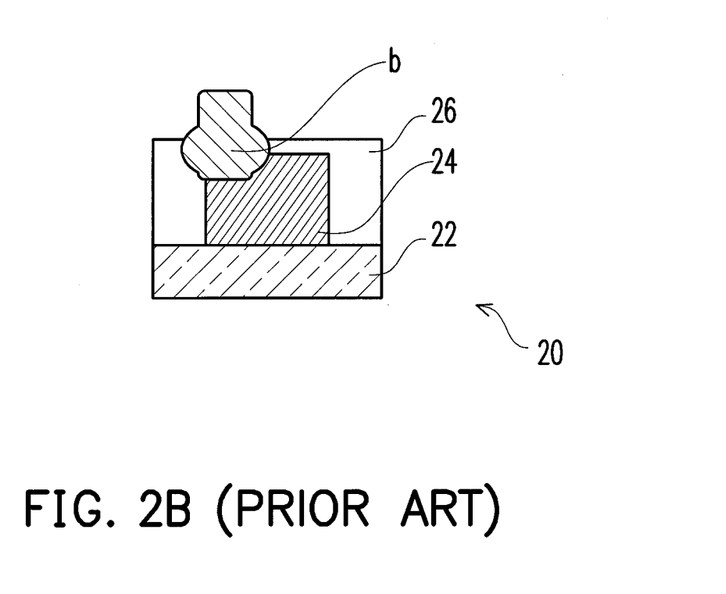
FIG. 2B is a cross-sectional view of the circuit board depicted in FIG. 2A along a line II-II.

FIG. 2A is a schematic top view of an abnormal wire bonding structure of a circuit board according to the pertinent art. FIG. 2B is a cross-sectional view of the circuit board depicted in FIG. 2A along a line II-II. Referring to FIGS. 2A and 2B, a circuit board 20 depicted in FIG. 2A is similar to the circuit board 10 depicted in FIG. 1A, while a difference therebetween lies in that a stud bump b is located at an edge of a wire bonding pad region 24b rather than at the center thereof due to errors occurring in the wire bonding process.

Specifically, according to the pertinent art, a thickness of a trace region 24a and a thickness of the wire bonding pad region 24b are the same, approximately 20 micro meters. Hence, when the stud bump b is located at the edge of the wire bonding pad region 24b, the stud bump b is less supported by a dielectric layer 22 in comparison with the stud bump b of FIGS. 1A and 1B. That is to say, stresses and pulling forces applied to the wire bonding pad region 24b are not able to be evenly distributed onto the circuit board 20, thereby generating a non-stick effect.

Nonetheless, in order to resolve the issue regarding the non-stick effect generated between the stud bump b and the wire bonding pad region 24b, a thickness of the trace region 24a and a thickness of the wire bonding pad region 24b are reduced from 20 micro meters to 10 micro meters. As such, the trace region 24a with the reduced thickness is less stress-resistant, and cracks would then be formed.

SUMMARY OF THE INVENTION

The present invention is directed to a circuit board serving as a carrier used in a wire bonding technology.

The present invention is further directed to a process of fabricating a circuit board serving as a carrier used in a wire bonding technology.

In the present invention, a circuit board including a dielectric layer, a circuit layer, and an insulation layer is provided. The circuit layer is disposed on the dielectric layer and has a pad region and a trace region. The insulation layer is disposed on the circuit layer and covers the trace region. A thickness of the pad region is less than a thickness of the trace region.

According to one embodiment of the present invention, the circuit board further includes an electrical connection layer disposed on the circuit layer and covering the pad region.

According to one embodiment of the present invention, a thickness of the electrical connection layer and the thickness of the pad region in total are less than half of the thickness of the trace region.

According to one embodiment of the present invention, the electrical connection layer is a nickel-gold composite layer or a palladium layer.

According to one embodiment of the present invention, the pad region is a wire bonding pad region.

According to one embodiment of the present invention, the thickness of the pad region is less than half of the thickness of the trace region.

The present invention further provides a process of fabricating a circuit board. First, a circuit substrate is provided. The circuit substrate includes a dielectric layer, a first patterned circuit layer, a second patterned circuit layer, and a first metal layer. The dielectric layer has at least a through hole penetrating the circuit substrate and respectively connected to two opposite surfaces of the dielectric layer. The first patterned circuit layer is disposed on one of the two opposite surfaces of the dielectric layer. The second patterned circuit layer is disposed on the other one of the two opposite surfaces of the dielectric layer. The first metal layer covers a wall of the through hole, the first patterned circuit layer, and the second patterned circuit layer.

Next, a patterned mask is formed on the first metal layer. Thereafter, a second metal layer is formed. The second metal layer covers a portion of the first metal layer, a portion of the first patterned circuit layer, and a portion of the second patterned circuit layer, wherein said portions of the first metal layer, the first patterned circuit layer, and the second patterned circuit layer are exposed by the patterned mask and the dielectric layer. Here, a trace region is defined by the second metal layer, the first metal layer, and the first patterned circuit layer. After that, the patterned mask is removed and a portion of the first metal layer is exposed, wherein a pad region is defined by the portion of the first metal layer exposed by the removed patterned mask and a portion of the underlying first patterned circuit layer. A thickness of the pad region is less than a thickness of the trace region. An insulation layer is then formed. Here, the through hole is filled with the insulation layer, and the insulation layer covers the trace region and a portion of the dielectric layer.

According to one embodiment of the present invention, the process of fabricating the circuit board further includes forming an electrical connection layer in the pad region after the insulation layer is formed. The electrical connection layer covers the exposed portion of the first metal layer.

According to one embodiment of the present invention, a thickness of the electrical connection layer and the thickness of the pad region in total are less than half of the thickness of the trace region.

According to one embodiment of the present invention, the electrical connection layer is a nickel-gold composite layer or a palladium layer.

According to one embodiment of the present invention, the pad region is a wire bonding pad region.

According to one embodiment of the present invention, the thickness of the pad region is less than half of the thickness of the trace region.

The present invention further provides a process of fabricating a circuit board. First, a circuit substrate is provided. The circuit substrate includes a dielectric layer, a first patterned circuit layer, a second patterned circuit layer, and a first metal layer. The dielectric layer has at least a through hole penetrating the circuit substrate and respectively connected to two opposite surfaces of the dielectric layer. The first patterned circuit layer is disposed on one of the two opposite surfaces of the dielectric layer. The second patterned circuit layer is disposed on the other one of the two opposite surfaces of the dielectric layer. The first metal layer covers a wall of the through hole, the first patterned circuit layer, and the second patterned circuit layer.

Thereafter, a second metal layer is formed. The second metal layer covers a portion of the first metal layer, a portion of the first patterned circuit layer, and a portion of the second patterned circuit layer, wherein said portions of the first metal layer, the first patterned circuit layer, and the second patterned circuit layer are exposed by the dielectric layer. Here, a trace region is defined by the second metal layer, the first metal layer, and the first patterned circuit layer. Next, a patterned mask is formed on the second metal layer. Afterwards, a portion of the second metal layer exposed by the patterned mask is etched with use of the patterned mask as an etching mask, and a portion of the first metal layer is then exposed. Here, a pad region is defined by the exposed portion of the first metal layer and a portion of the underlying first patterned circuit layer. A thickness of the pad region is less than a thickness of the trace region. Thereafter, the patterned mask is removed. An insulation layer is then formed. Here, the through hole is filled with the insulation layer, and the insulation layer covers the trace region and a portion of the dielectric layer.

According to one embodiment of the present invention, the process of fabricating the circuit board further includes forming an electrical connection layer in the pad region after the insulation layer is formed. The electrical connection layer covers the exposed portion of the first metal layer.

According to one embodiment of the present invention, a thickness of the electrical connection layer and the thickness of the pad region in total are less than half of the thickness of the trace region.

According to one embodiment of the present invention, the electrical connection layer is a nickel-gold composite layer or a palladium layer.

According to one embodiment of the present invention, the pad region is a wire bonding pad region.

According to one embodiment of the present invention, the thickness of the pad region is less than half of the thickness of the trace region.

In light of the foregoing, the thickness of the pad region is less than the thickness of the trace region in the circuit board of the present invention. Hence, when the wire bonding process is performed on the circuit board, the stud bump can be better supported by the dielectric layer, so as to prevent occurrence of a non-stick effect between the stud bump and the pad region and avoid the trace region from being cracked due to stresses.

In order to make the above and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 3A:
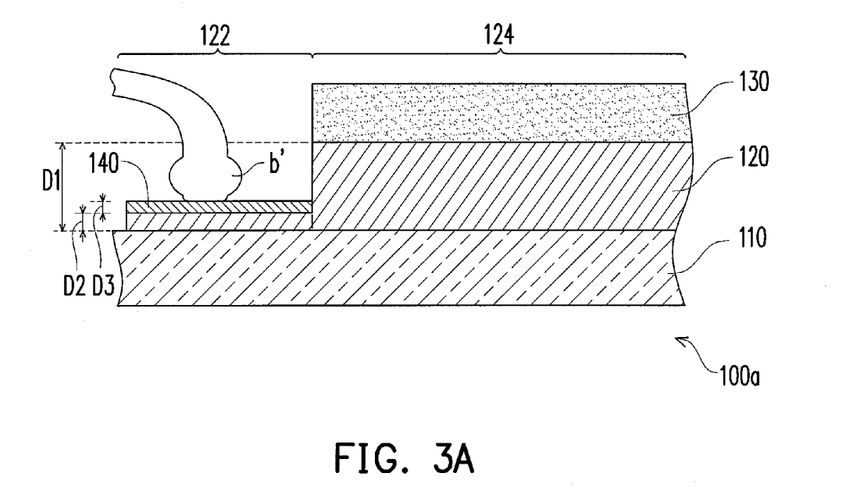
FIG. 3A is a schematic view of a circuit board according to an embodiment of the present invention.

FIG. 3A is a schematic view of a circuit board according to an embodiment of the present invention. Referring to FIG. 3A, in the present embodiment, a circuit board 100a includes a dielectric layer 110, a circuit layer 120, and an insulation layer 130. The circuit layer 120 is disposed on the dielectric layer 110 and has a pad region 122 and a trace region 124. The insulation layer 130 is disposed on the circuit layer 120 and covers the trace region 124. Here, a thickness D2 of the pad region 122 is less than a thickness D1 of the trace region 124. In particular, according to the present embodiment, the thickness D2 of the pad region 122 is less than half of the thickness D1 of the trace region 124. The pad region 122 is a wire bonding pad region for connecting a stud bump b' formed in a wire bonding process. The insulation layer 130 is a solder mask layer for protecting circuits in the trace region 124.

Note that the circuit board 100a can have a single circuit layer 120 or multiple circuit layers. That is to say, the circuit board 100a can be a single layer circuit board, a double layer circuit board, or a multi-layer circuit board. In the present embodiment, the circuit board 100a depicted in FIG. 3A is the single layer circuit board.

Besides, in the present embodiment, the circuit board 100a further includes an electrical connection layer 140. The electrical connection layer 140 is a nickel-gold composite layer or a palladium layer, for example. In addition, the electrical connection layer 140 is disposed on the circuit layer 120 and covers the pad region 122. A thickness D3 of the electrical connection layer 140 and the thickness D2 of the pad region 122 in total are less than half of the thickness D1 of the trace region 124. Namely, in comparison with the thickness D2 of the pad region 122, the thickness D1 of the trace region 124 is great enough to resist the stresses.

Figure 3B:
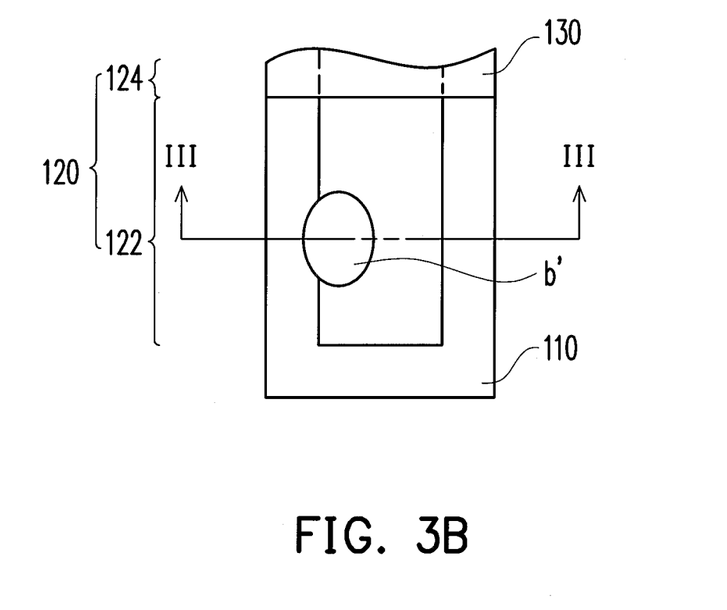
FIG. 3B is a schematic top view of the circuit board depicted in FIG. 3A along a line III-III.
Figure 3C:
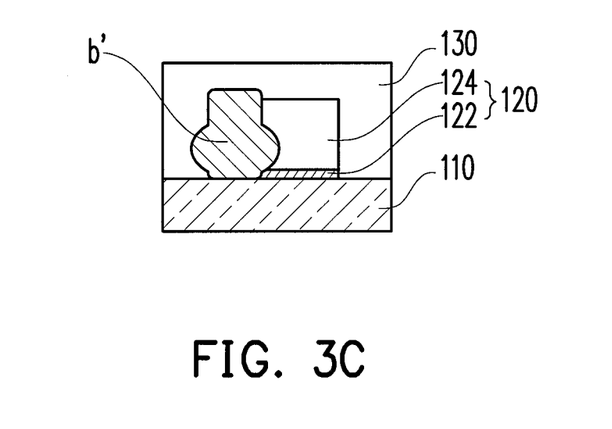
FIG. 3C is a cross-sectional view of the circuit board depicted in FIG. 3B.

FIG. 3B is a schematic top view of the circuit board depicted in FIG. 3A along a line III-III. FIG. 3C is a cross-sectional view of the circuit board depicted in FIG. 3B. For purposes of illustration, FIGS. 3B and 3C merely depict a partial structure of the circuit board. Referring to FIGS. 3A, 3B, and 3C, in subsequent manufacturing processes, since the thickness D3 of the electrical connection layer 140 and the thickness D2 of the pad region 122 in total are less than half of the thickness D1 of the trace region 124, the stud bump b' can be better supported by the dielectric layer 110 when the stud bump b' is formed on the electrical connection layer 140 during the wire bonding process performed on the circuit board 100a. Thereby, a non-stick effect is not prone to occur between the stud bump b' and the pad region 122.

Specifically, as indicated above, the thickness D2 of the pad region 122 is less than the thickness D1 of the trace region 124, and thereby the stud bump b' is better supported by the dielectric layer 110. Hence, given that the stud bump b' is located at an edge of the pad region 122 rather than at the center of the pad region 122, a portion of the stud bump b' located outside the pad region 122 can still be supported by the dielectric layer 110, so as to distribute parts of the stresses onto the dielectric layer 110. As a result, the non-stick effect is not apt to occur between the stud bump b' and the pad region 122. In brief, the circuit board 100a of the present embodiment is able to prevent the non-stick effect from occurring between the stud bump b' and the pad region 122. Additionally, the thickness D1 of the trace region 124 is greater than the thickness D2 of the pad region 122 according to the present embodiment, and therefore the trace region 124 is sufficiently stress-resistant for precluding the trace region 124 from being cracked due to the stresses.

To sum up, the thickness D2 of the pad region 122 is less than half of the thickness D1 of the trace region 124 in the circuit board 100a of the present embodiment. Accordingly, when the wire bonding process is performed on the circuit board 100a, the stud bump b' can be better supported by the dielectric layer 110, so as to prevent occurrence of the non-stick effect between the stud bump b' and the pad region 122 to a certain degree and avoid the trace region 124 from being cracked due to the stresses.

Up to here, only the structure of the circuit board 100a of the present invention is described, while a process of fabricating the circuit board 100a of the present invention is not yet provided. With reference to FIGS. 4A through 4F and FIGS. 5A through 5G, a process of fabricating a circuit board 100b and a process of fabricating a circuit board 100c are respectively explained in the following two different embodiments in which the circuit boards 100b and 100c are double-sided circuit boards.

Figure 4A:
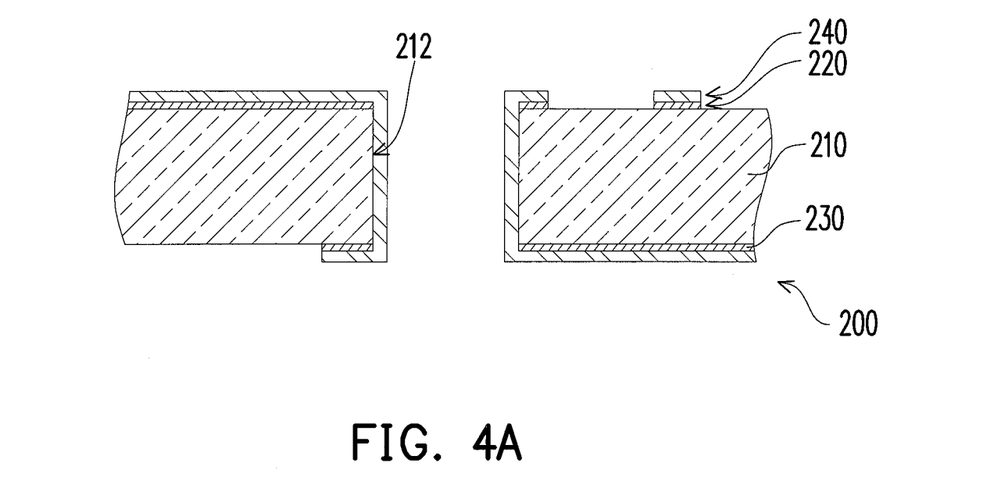
FIGS. 4A through 4F illustrate a process of fabricating a circuit board according to an embodiment of the present invention.

FIGS. 4A through 4F illustrate a process of fabricating the circuit board according to an embodiment of the present invention. Referring to FIG. 4A, in the process of fabricating the circuit board 100b according to the present embodiment, a circuit substrate 200 is provided at first. The circuit substrate 200 includes a dielectric layer 210, a first patterned circuit layer 220, a second patterned circuit layer 230, and a first metal layer 240.

In detail, the dielectric layer 210 has at least a through hole 212, while only one through hole 212 is schematically depicted in FIG. 4A. The through hole 212 penetrates the circuit substrate 200 and is connected to two opposite surfaces of the dielectric layer 210, respectively. The first patterned circuit layer 220 is disposed on one of the two opposite surfaces of the dielectric layer 210, and the second patterned circuit layer 230 is disposed on the other one of the two opposite surfaces of the dielectric layer 210. The first metal layer 240 covers a wall of the through hole 212, the first patterned circuit layer 220, and the second patterned circuit layer 230.

Figure 4B:
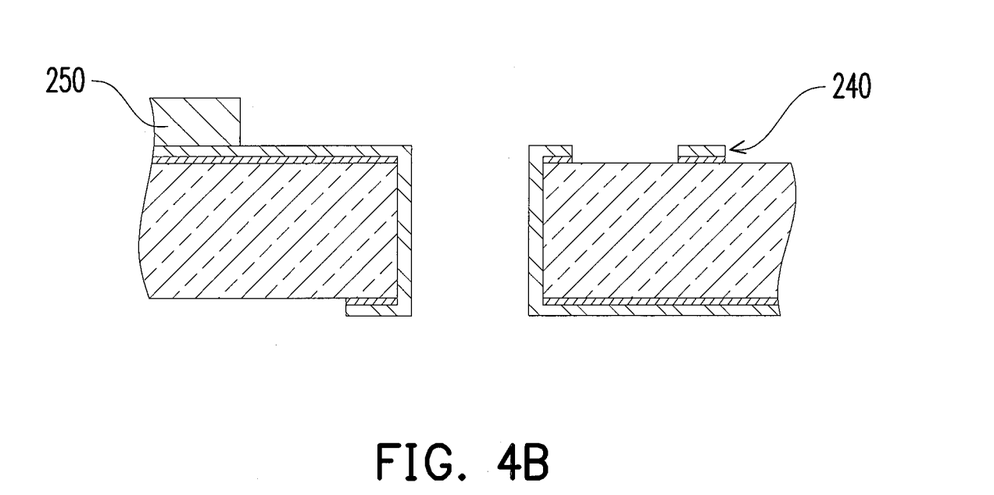

Referring to FIG. 4B, a patterned mask 250 is then formed on the first metal layer 240.

Figure 4C:
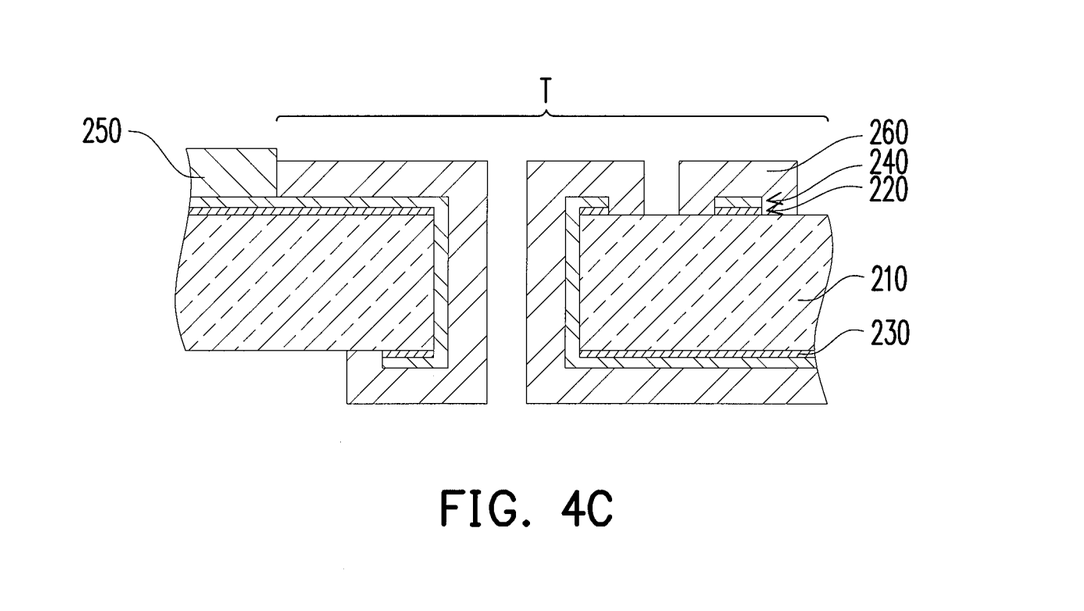

Next, referring to FIG. 4C, a second metal layer 260 is formed. The second metal layer 260 covers a portion of the first metal layer 240, a portion of the first patterned circuit layer 220, and a portion of the second patterned circuit layer 230, wherein said portions of the first metal layer 240, the first patterned circuit layer 220, and the second patterned circuit layer 230 are exposed by the patterned mask 250 and the dielectric layer 210. Here, a trace region T is defined by the second metal layer 260, the first metal layer 240, and the first patterned circuit layer 220.

Figure 4D:
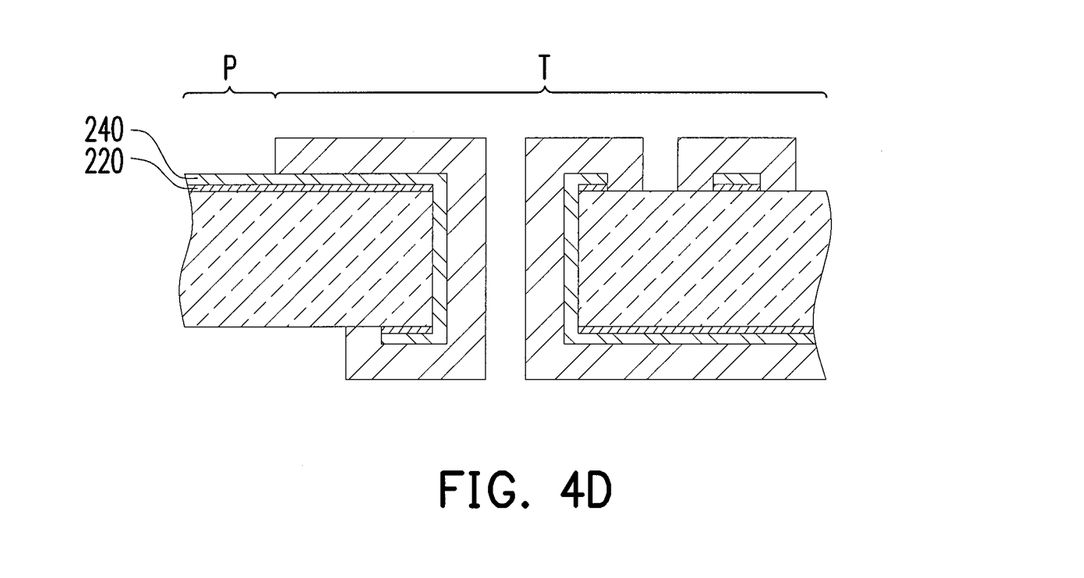

Thereafter, referring to FIG. 4D, the patterned mask 250 is removed, and a portion of the first metal layer 240 is then exposed. A pad region P is defined by the portion of the first metal layer 240 exposed by the removed patterned mask 250 and a portion of the underlying first patterned circuit layer 220, and a thickness of the pad region P is less than a thickness of the trace region T. Note that the thickness of the pad region P is less than half of the thickness of the trace region T according to the present embodiment. Here, the pad region P is a wire bonding pad region.

Figure 4E:
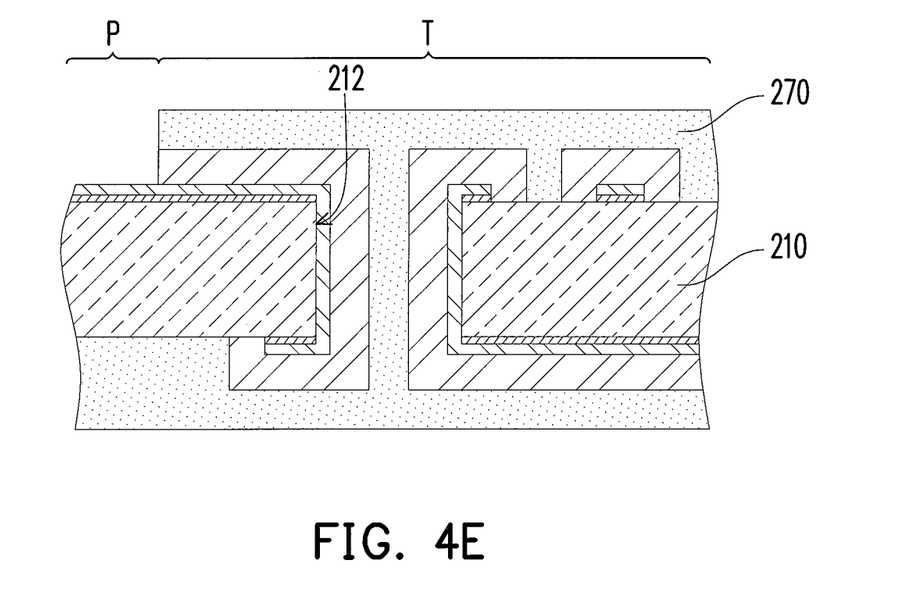

After that, referring to FIG. 4E, an insulation layer 270 is formed, and the through hole 212 is filled with the insulation layer 270. Besides, the insulation layer 270 covers the trace region T and a portion of the dielectric layer 210. Namely, the pad region P is not covered by the insulation layer 270.

Figure 4F:
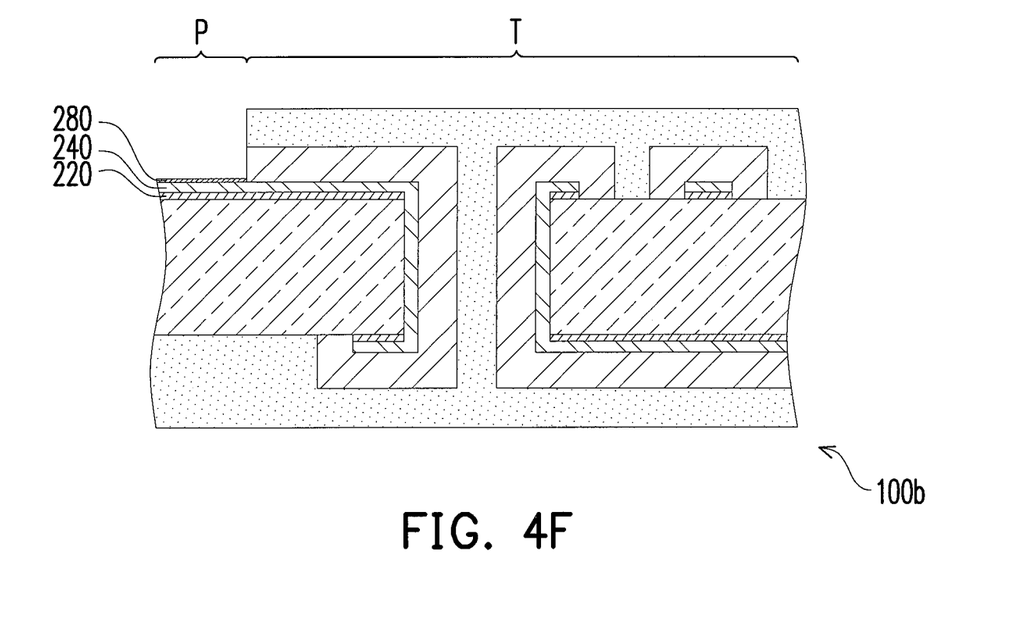

Referring to FIG. 4F, after the formation of the insulation layer 270, an electrical connection layer 280 is formed in the pad region P. Here, the electrical connection layer 280 is, for example, a nickel-gold composite layer or a palladium layer, so as to protect the pad region P from being oxidized.

Particularly, the electrical connection layer 280 covers the portion of the first metal layer 240 exposed by the removed patterned mask 250, and a thickness of the electrical connection layer 280 and the thickness of the pad region P in total are less than half of the thickness of the trace region T. In other words, the thickness of the trace region T is greater than the thickness of the electrical connection layer 280 and the thickness of the pad region P. Up to here, the circuit board 100b is basically formed.

In short, in the process of fabricating the circuit board 100b according to the present embodiment, a semi-additive process is implemented to additionally form the second metal layer 260 between the patterned mask 250 and a portion of the first metal layer 240. After the formation of the second metal layer 260, the patterned mask 250 is removed, so as to form the pad region P and the trace region T with different thicknesses. The thickness of the pad region P is less than half of the thickness of the trace region T in the present embodiment. Hence, when a wire bonding process is subsequently performed on the circuit board 100b, occurrence of the non-stick effect between wires and the pad region P can be avoided to a greater extent, and the trace region T can be prevented from being cracked due to stresses.

Figure 5A:
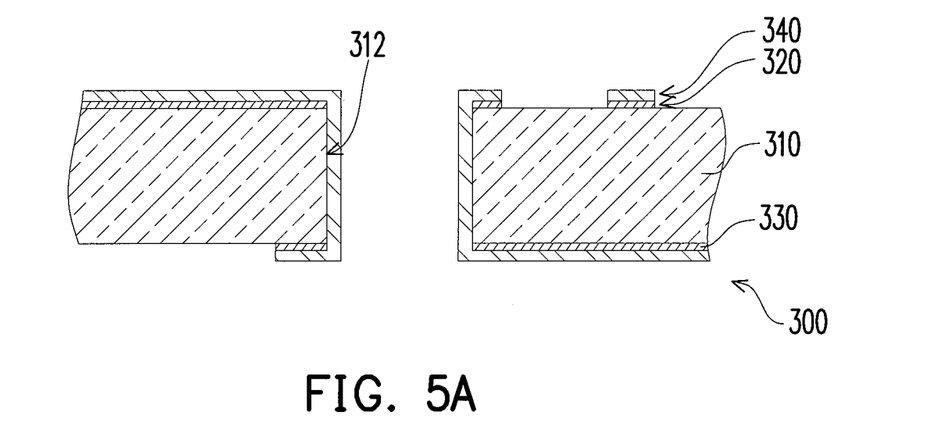
FIGS. 5A through 5G illustrate a process of fabricating a circuit board according to another embodiment of the present invention.

FIGS. 5A through 5G illustrate a process of fabricating the circuit board according to another embodiment of the present invention. Referring to FIG. 5A, in the process of fabricating the circuit board 100c according to the present embodiment, a circuit substrate 300 is provided at first. The circuit substrate 300 includes a dielectric layer 310, a first patterned circuit layer 320, a second patterned circuit layer 330, and a first metal layer 340.

In detail, the dielectric layer 310 has at least a through hole 312, while only one through hole 312 is schematically depicted in FIG. 5A, The through hole 312 penetrates the circuit substrate 300 and is connected to two opposite surfaces of the dielectric layer 310, respectively. The first patterned circuit layer 320 is disposed on one of the two opposite surfaces of the dielectric layer 310. The second patterned circuit layer 330 is disposed on the other one of the two opposite surfaces of the dielectric layer 310. The first metal layer 340 covers a wall of the through hole 312, the first patterned circuit layer 320, and the second patterned circuit layer 330.

Figure 5B:
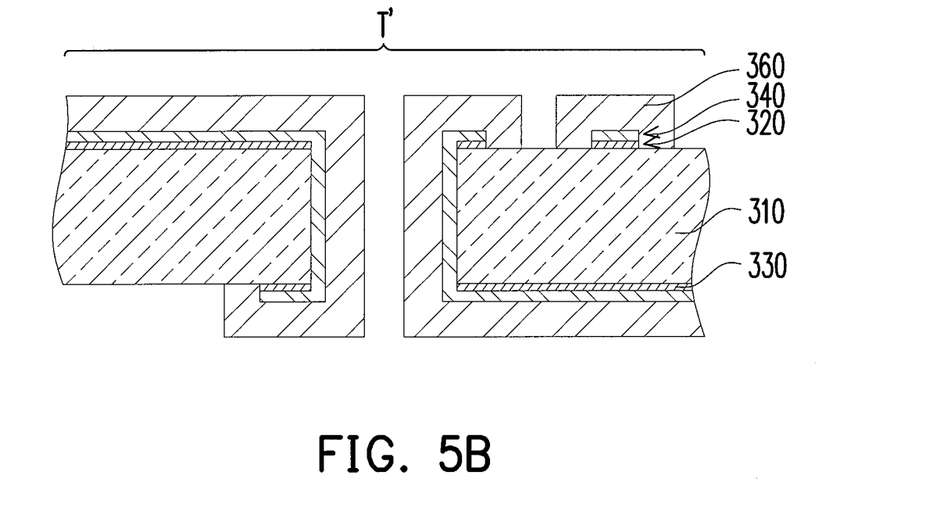

Next, referring to FIG. 5B, a second metal layer 360 is formed. Particularly, the second metal layer 360 covers a portion of the first metal layer 340, a portion of the first patterned circuit layer 320, and a portion of the second patterned circuit layer 330, wherein said portions of the first metal layer 340, the first patterned circuit layer 320, and the second patterned circuit layer 330 are exposed by the dielectric layer 310. Here, a trace region T' is defined by the second metal layer 360, the first metal layer 340, and the first patterned circuit layer 320.

Figure 5C:
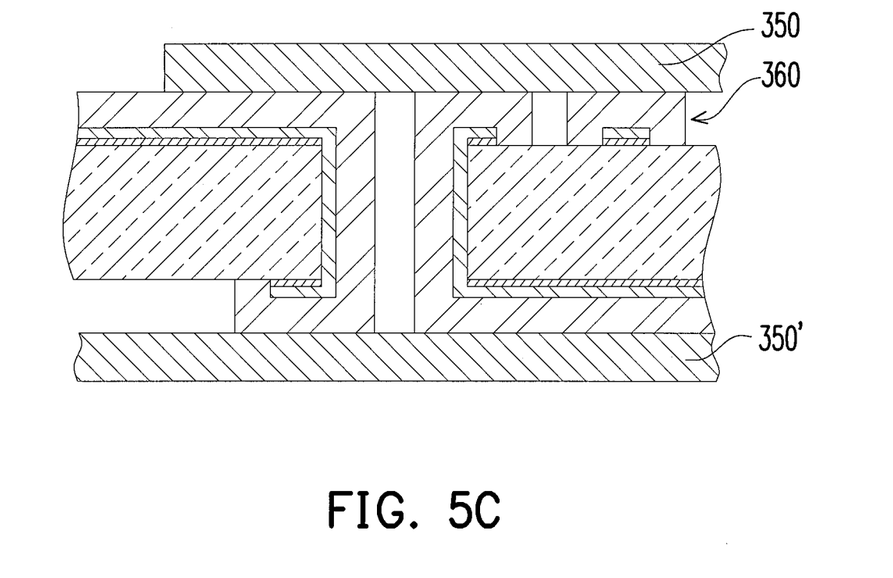
Figure 5D:
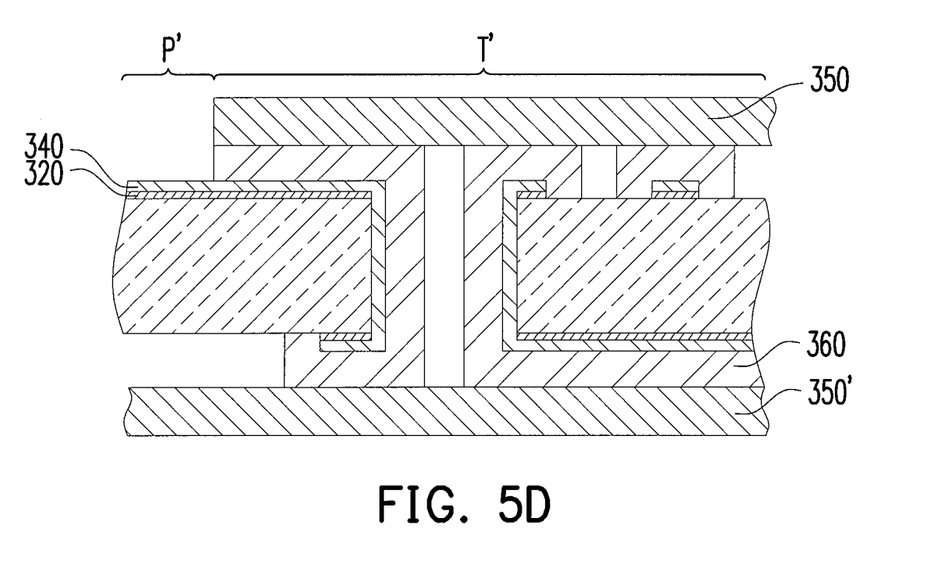

Afterwards, referring to FIGS. 5C and 5D, two patterned masks 350 and 350' are formed on the second metal layer 360. Thereafter, a portion of the second metal layer 360 exposed by the patterned mask 350 is etched with use of the patterned mask 350 as an etching mask, and a portion of the first metal layer 340 is then exposed. Here, a pad region P' is defined by the exposed portion of the first metal layer 340 and a portion of the underlying first patterned circuit layer 320. A thickness of the pad region P' is less than a thickness of the trace region T'. Note that the thickness of the pad region P' is less than half of the thickness of the trace region T' according to the present embodiment. Here, the pad region P' is a wire bonding pad region.

Figure 5E:
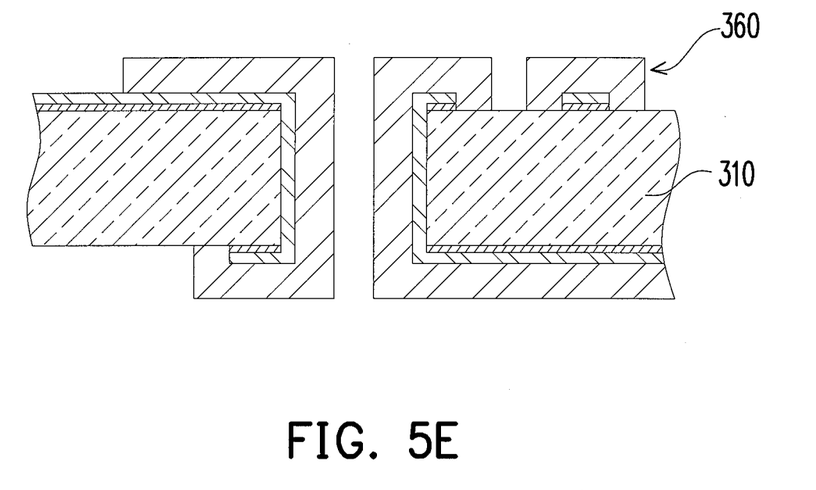

Thereafter, referring to FIG. 5E, the patterned masks 350 and 350' are removed, and a portion of the second metal layer 360 that is not etched and a portion of the dielectric layer 310 are exposed.

Figure 5F:
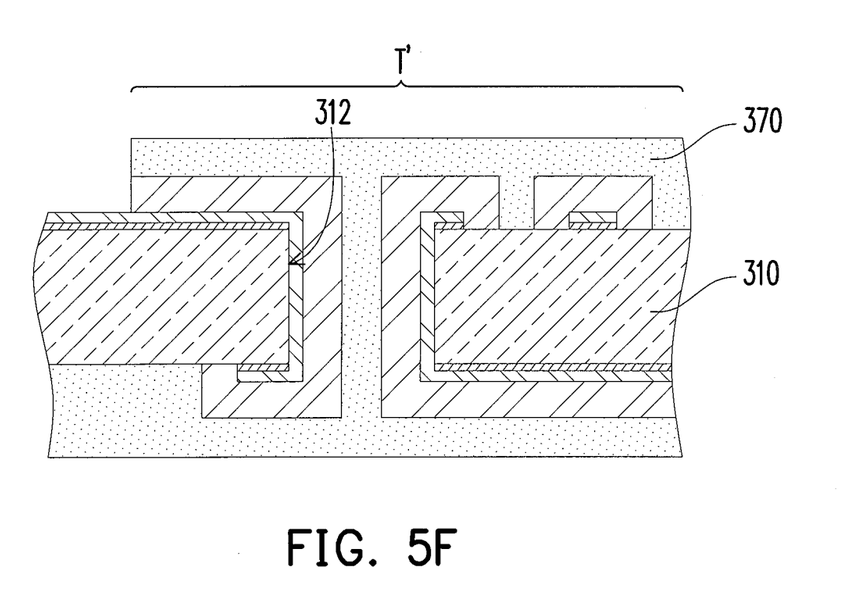

After that, referring to FIG. 5F, an insulation layer 370 is formed, and the through hole 312 is filled with the insulation layer 370. Besides, the insulation layer 370 covers the trace region T' and a portion of the dielectric layer 310. Namely, the pad region P' is not covered by the insulation layer 370.

Figure 5G:
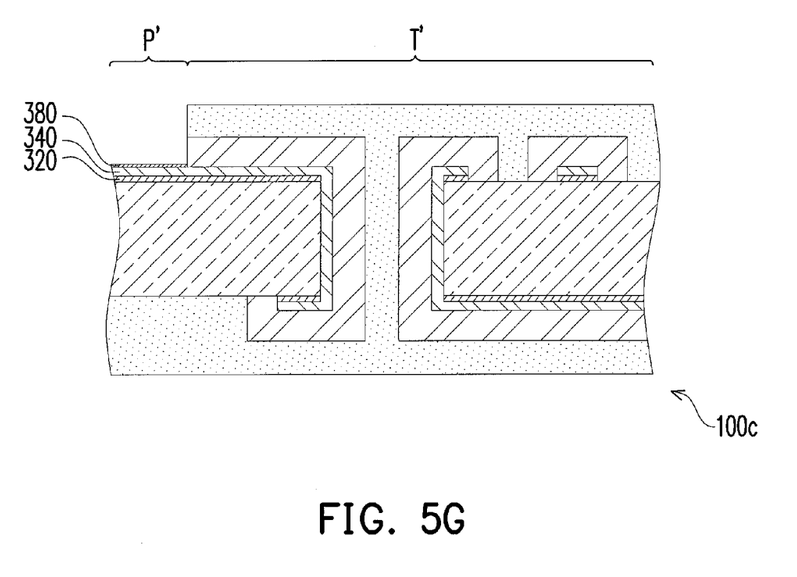

Referring to FIG. 5G, after the formation of the insulation layer 370, an electrical connection layer 380 is formed in the pad region P'. Here, the electrical connection layer 380 is, for example, a nickel-gold composite layer or a palladium layer, so as to protect the pad region P' from being oxidized.

Particularly, the electrical connection layer 380 covers the exposed portion of the first metal layer 340, and a thickness of the electrical connection layer 380 and the thickness of the pad region P' in total are less than half of the thickness of the trace region T'. In other words, the thickness of the trace region T' is greater than the thickness of the electrical connection layer 380 and the thickness of the pad region P'. Up to here, the circuit board 100c is basically formed.

In brief, the circuit board 100c of the present embodiment is formed by performing a subtractive process. A portion of the second metal layer 360 in the circuit board 100c is etched with use the patterned mask 350 as the etching mask, so as to expose a portion of the first metal layer 340. After the removal of the patterned mask 350, the pad region P' and the trace region T' with different thicknesses are formed. The thickness of the pad region P' is less than half of the thickness of the trace region T' according to the present embodiment. Hence, when the wire bonding process is subsequently performed on the circuit board 100c, occurrence of the non-stick effect between wires and the pad region P' can be avoided to a greater extent, and the trace region T' can be prevented from being cracked due to stresses.

Figure 6A:
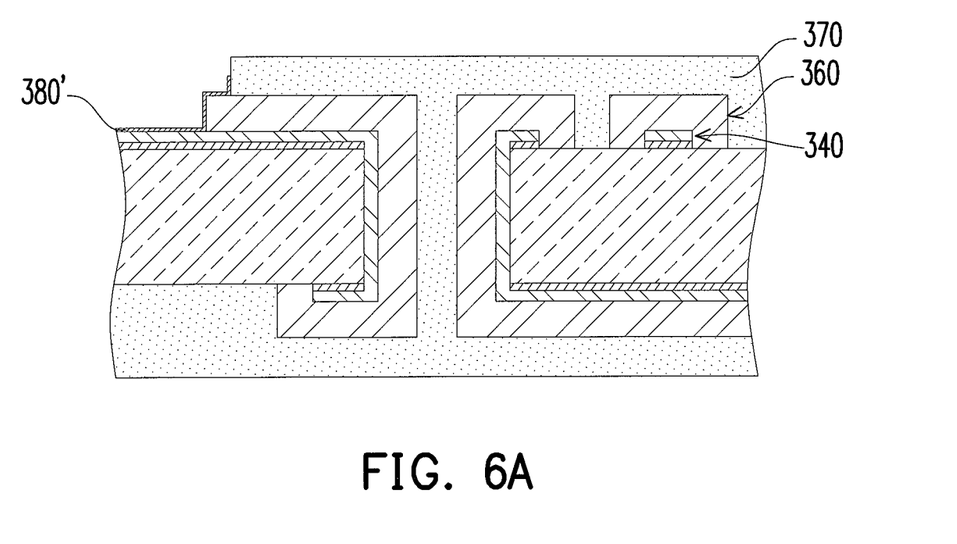
FIG. 6A is a schematic view of a circuit board according to another embodiment of the present invention.
Figure 6B:
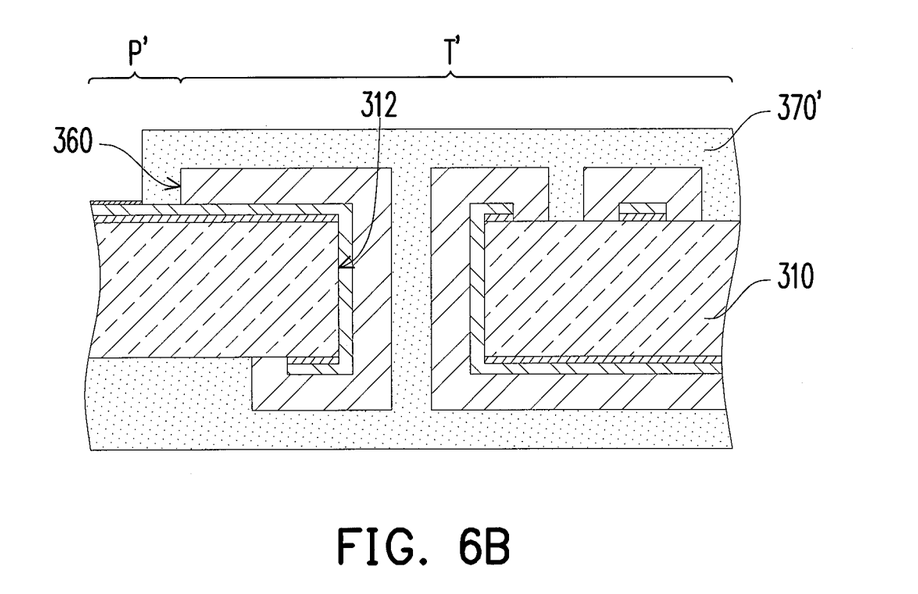
FIG. 6B is a schematic view of a circuit board according to still another embodiment of the present invention.

It should be mentioned the processes of fabricating the circuit boards 100b and 100c are frequently affected by manufacturing tolerance. For instance, given that the circuit board 100c is affected by the manufacturing tolerance during the formation of the electrical connection layer 380, it is likely for an electrical connection layer 380' formed thereby to cover the first metal layer 340, a junction of the first metal layer 340 and the second metal layer 360, and a junction of the second metal layer 360 and the insulation layer 370 as shown in FIG. 6A. Certainly, given that the manufacturing tolerance poses an impact during the formation of the insulation layer 370, the through hole 312 may be filled with an insulation layer 370' formed thereby, and the insulation layer 370' may cover the trace region T', a portion of the dielectric layer 310, and a junction of the pad region P' and the second metal layer 360 as shown in FIG. 6B.

In light of the foregoing, the thickness of the pad region is less than half of the thickness of the trace region in the circuit board of the present invention. Hence, when the wire bonding process is performed on the circuit board, the stud bump can be better supported by the dielectric layer, so as to prevent occurrence of the non-stick effect between the stud bump and the pad region. Meanwhile, since the thickness of the trace region is greater than the thickness of the pad region, the trace region can be prevented from being cracked due to the stresses.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of fabricating a circuit board, comprising:
   providing a circuit substrate, the circuit substrate comprising:
   a dielectric layer, having at least a through hole penetrating the circuit substrate and respectively connected to two opposite surfaces of the dielectric layer;
   a first patterned circuit layer, disposed on one of the two opposite surfaces of the dielectric layer;

a second patterned circuit layer, disposed on the other one of the two opposite surfaces of the dielectric layer; and a first metal layer, covering a wall of the through hole, the first patterned circuit layer, and the second patterned circuit layer;

forming a patterned mask on the first metal layer;

forming a second metal layer covering a portion of the first metal layer;

removing the patterned mask and exposing a portion of the first metal layer; and forming an insulation layer on the second metal layer, and a portion of the dielectric layer.

2. The process of fabricating the circuit board as claimed in claim 1, further comprising:

forming an electrical connection layer after the insulation layer is formed, the electrical connection layer covering the exposed portion of the first metal layer.

3. The process of fabricating the circuit board as claimed in claim 2, wherein a trace region is defined by the second metal layer, the first metal layer, and the first patterned circuit layer, a pad region is defined by the portion of the first metal layer exposed by the removed patterned mask and a portion of the underlying first patterned circuit layer, and a thickness of the electrical connection layer and the thickness of the pad region in total are less than half of the thickness of the trace region.

4. The process of fabricating the circuit board as claimed in claim 2, wherein the electrical connection layer is a nickel-gold composite layer or a palladium layer.

5. The process of fabricating the circuit board as claimed in claim 1, wherein a pad region is defined by the portion of the first metal layer exposed by the removed patterned mask and a portion of the underlying first patterned circuit layer, and the pad region is a wire bonding pad region.

6. The process of fabricating the circuit board as claimed in claim 1, wherein a trace region is defined by the second metal layer, the first metal layer, and the first patterned circuit layer, a pad region is defined by the portion of the first metal layer exposed by the removed patterned mask and a portion of the underlying first patterned circuit layer, and the thickness of the pad region is less than half of the thickness of the trace region.

7. A process of fabricating a circuit board, comprising:

providing a circuit substrate, the circuit substrate comprising:

a dielectric layer, having at least a through hole penetrating the circuit substrate and respectively connected to two opposite surfaces of the dielectric layer;

a first patterned circuit layer, disposed on one of the two opposite surfaces of the dielectric layer;

a second patterned circuit layer, disposed on the other one of the two opposite surfaces of the dielectric layer;

a first metal layer, covering a wall of the through hole, the first patterned circuit layer, and the second patterned circuit layer;

forming a second metal layer covering a portion of the first metal layer, a portion of the first patterned circuit layer, and a portion of the second patterned circuit layer, said portions of the first metal layer, the first patterned circuit layer, and the second patterned circuit layer being exposed by the dielectric layer, wherein a trace region is defined by the second metal layer, the first metal layer, and the first patterned circuit layer;

forming a patterned mask on the second metal layer;

etching a portion of the second metal layer exposed by the patterned mask with use of the patterned mask as an etching mask and exposing a portion of the first metal layer, wherein a pad region is defined by the exposed portion of the first metal layer and a portion of the underlying first patterned circuit layer, and a thickness of the pad region is less than a thickness of the trace region;

removing the patterned mask; and forming an insulation layer, wherein the through hole is filled with the insulation layer, and the insulation layer covers the trace region and a portion of the dielectric layer.

8. The process of fabricating the circuit board as claimed in claim 7, further comprising:

forming an electrical connection layer in the pad region after the insulation layer is formed, the electrical connection layer covering the exposed portion of the first metal layer.

9. The process of fabricating the circuit board as claimed in claim 8, wherein a thickness of the electrical connection layer and the thickness of the pad region in total are less than half of the thickness of the trace region.

10. The process of fabricating the circuit board as claimed in claim 8, wherein the electrical connection layer is a nickel-gold composite layer or a palladium layer.

11. The process of fabricating the circuit board as claimed in claim 7, wherein the pad region is a wire bonding pad region.

12. The process of fabricating the circuit board as claimed in claim 7, wherein the thickness of the pad region is less than half of the thickness of the trace region.

* * * * *

UNITED STATES PATENT AND TRADEMARK OFFICE
CERTIFICATE OF CORRECTION

| | |
|---|---|
| PATENT NO. | : 8,720,053 B2 |
| APPLICATION NO. | : 12/535895 |
| DATED | : May 13, 2014 |
| INVENTOR(S) | : Lee et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1062 days.

Signed and Sealed this
Eighth Day of September, 2015

Michelle K. Lee
*Director of the United States Patent and Trademark Office*